(12) United States Patent
Nelson (10) Patent No.: US 9,621,972 B2
(45) Date of Patent: Apr. 11, 2017

(54) BURST-MODE RECEIVER (71) Applicant: ROCKLEY PHOTONICS LIMITED, Marlborough (GB)

(72) Inventor: David Arlo Nelson, Fort Collins, CO (US)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 14/813,081

(22) Filed: Jul. 29, 2015

(65) Prior Publication Data

US 2017/0034607 A1    Feb. 2, 2017

(51) Int. Cl.
| | |
|---|---|
| *H04B 10/00* | (2013.01) |
| *H04Q 11/00* | (2006.01) |
| *H03F 3/08* | (2006.01) |

(52) U.S. Cl.
CPC .......... *H04Q 11/0071* (2013.01); *H03F 3/08* (2013.01); *H04Q 11/0066* (2013.01)

(58) Field of Classification Search
USPC ............................................... 398/202–214
See application file for complete search history.

(56) References Cited

U.S. PATENT DOCUMENTS

| | | | | |
|---|---|---|---|---|
| 5,208,693 | A * | 5/1993 | Arstein .................. | H03K 5/084 398/100 |
| 5,412,498 | A * | 5/1995 | Arstein .................. | H03K 5/084 370/436 |
| 6,694,105 | B2 * | 2/2004 | Chang .................. | H04L 25/061 327/63 |
| 7,920,798 | B2 * | 4/2011 | Wong ..................... | H03K 5/084 398/208 |
| 8,050,573 | B2 * | 11/2011 | Zhang .................... | H04B 10/69 375/319 |
| 8,190,035 | B2 * | 5/2012 | Blauvelt .............. | H04B 10/693 250/214 A |

(Continued)

FOREIGN PATENT DOCUMENTS

| | | |
|---|---|---|
| EP | 2 161 858 A1 | 3/2010 |
| WO | WO 2011/134213 A1 | 11/2011 |

OTHER PUBLICATIONS

GB Search Report for Patent Application No. GB1514929.7, dated Oct. 12, 2015, 1 page.

(Continued)

*Primary Examiner* — Agustin Bello
(74) *Attorney, Agent, or Firm* — Leiwis Roca Rothgerber Christie LLP (57) ABSTRACT

Provided is a burst-mode receiver configured to receive an optical signal having a preamble and a data payload, the burst-mode receiver including a first bias resistor coupled between a first voltage supply and a photosensor, a first capacitor coupled between the photosensor and an amplifier, a first common-mode resistor configured to supply a voltage of a common-mode voltage supply to the amplifier, a first bypass switch configured to couple the first capacitor to the common-mode voltage supply while bypassing the first common-mode resistor, and a first data switch configured to couple the first capacitor to the amplifier, and to couple the first capacitor to the common-mode voltage supply through the first common-mode resistor.

19 Claims, 3 Drawing Sheets

(56) References Cited

U.S. PATENT DOCUMENTS

| | | | |
|---|---|---|---|
| 8,433,206 B2* | 4/2013 | Kim | H04B 10/6933 398/209 |
| 8,705,985 B2* | 4/2014 | Christensen | H04B 10/695 398/206 |
| 8,824,903 B2* | 9/2014 | Christensen | H04B 10/0731 398/197 |
| 2003/0067662 A1* | 4/2003 | Brewer | H04B 10/695 398/202 |
| 2003/0092411 A1 | 5/2003 | Ivry | |
| 2007/0071455 A1* | 3/2007 | Margalit | H04B 10/691 398/202 |
| 2007/0264031 A1* | 11/2007 | Dalton | H04B 10/69 398/208 |
| 2007/0286611 A1 | 12/2007 | Weber et al. | |
| 2008/0310861 A1* | 12/2008 | Wong | H03K 5/084 398/210 |
| 2009/0196632 A1* | 8/2009 | Zhang | H04B 10/69 398/202 |
| 2010/0119240 A1* | 5/2010 | Feng | H04B 10/69 398/202 |
| 2010/0158541 A1* | 6/2010 | Tsunoda | H04B 10/6971 398/208 |
| 2010/0278542 A1* | 11/2010 | Dalton | H04B 10/69 398/210 |
| 2011/0222867 A1* | 9/2011 | Dietz | H03F 3/087 398/203 |
| 2013/0121707 A1* | 5/2013 | Ossieur | H03G 3/3073 398/209 |
| 2013/0287395 A1* | 10/2013 | Dvir | H04B 10/69 398/43 |
| 2015/0063831 A1* | 3/2015 | Nejadmalayeri | H04B 10/695 398/212 |

OTHER PUBLICATIONS

Rylyakov, Alexander et al., "A 25Gb/s Burst-Mode Receiver for Rapidly Reconfigurable Optical Networks," IBM T.J. Watson Research Center, Yorktown Heights, NY, International Solid-State Circuits Conference, 2015 IEEE, pp. 1-41.

Qiu, Xing-Zhi, "[OFC 2013 Tutorial OW3G.4] Burst-mode Receiver Technology for Short Synchronization," Ghent University, Information Technology Department (INTEC), Interuniversity MicroElectronics Center (IMEC), Belgium, http://www.intec.ugent.be, pp. 1-55.

Patent Examination under Section 18(3) issued in parallel Great Britain Application No. GB1514929.7 dated Oct. 13, 2016, 3 pages.

International Search Report and Written Opinion of the International Searching Authority, Mailed Nov. 4, 2016, Corresponding to PCT/GB2016/052335, 11 pages.

* cited by examiner

BURST-MODE RECEIVER

FIELD

Aspects of embodiments of the invention relate to the field of optical switching and, in particular, to receivers in optical switching systems.

BACKGROUND

Current and next-generation optical networks require ultrahigh transmission speeds and fast packet switching to support a growing need for multimedia applications. Advances in fiber-optic technology (e.g., erbium-doped fiber amplifiers (EDFAs), high-speed time multiplexing/demultiplexing, high density wavelength division multiplexing (WDM) devices, optical tunable filters, etc.) have led researchers to envision a future all-optical network that is capable of supporting multiple access and services at a very high bit rate.

In such all-optical multi-access networks, any node can use a designated time slot to send a packet to some other nodes. One significant difference between an all-optical multi-access network and a conventional point-to-point link is that the amplitude and phase of the received packets in an all-optical multi-access network may be quite different from packet to packet due to different fiber attenuation and the chromatic dispersion caused by the variation of the transmitters' wavelengths. For example, the amount of amplitude variation between two bursts of data packets can be as high as 10-20 dB.

Some related art receivers are not suitable for burst-mode operation because they cannot instantaneously handle the different arriving packets with large difference in optical power. It is therefore desirable to design receivers that can adapt to the variation in optical power on a packet-by-packet basis. These types of receivers are commonly referred to as burst-mode receivers, which are generally either of the feedback type or the feedforward type.

The feedback type receiver uses a differential transimpedance amplifier with a peak detection circuit to form a feedback loop. The peak detector circuit determines the instantaneous detection threshold for the incoming optical signal. The preamplifier extracts the signal's amplitude, and is DC-coupled at the output to a differential post-amplifier for further amplification. While a feedback loop enables the receiver to work more reliably and accurately, feedback loops increase the time required to settle to a final value. They also introduce additional circuitry which increases power dissipation.

In feedforward type receivers, the received optical signal is first amplified by a DC-coupled preamplifier and then output to a differential amplifier and fed forward into a peak detection circuitry to recover the amplitude of received packets. The peak detector determines a proper threshold level that may be set in front of the differential amplifier. At the output of the differential amplifier, the amplitude-recovered data packet is ready for further processing. As this scheme does not employ a feedback loop, the circuitry needs to be carefully designed to prevent oscillation in the receiver. This type of design introduces compromises: a fast settling system will, for example, introduce baseline wander that will degrade receiver sensitivity.

The above information disclosed in this Background section is only for enhancement of understanding of the background of the invention, and therefore this Background section may contain information that does not form the prior art that is already known to a person of ordinary skill in the art.

SUMMARY

Aspects of some embodiments of the invention are directed to a high-speed receiver in an optical switching system.

Aspects of some embodiments of the invention are directed to an optical burst-mode receiver having high dynamic range and fast response time (e.g., fast acquisition speeds) to improve (e.g., increase) detection of burst data (e.g., short burst data). The burst-mode receiver further employs a simple implementation with relatively few components in order to improve robustness and network reliability.

According to some embodiments of the invention, there is provided a burst-mode receiver configured to receive an optical signal having a preamble and a data payload, the burst-mode receiver including: a first bias resistor coupled between a first voltage supply and a photosensor; a first capacitor coupled between the photosensor and an amplifier; a first common-mode resistor configured to supply a voltage of a common-mode voltage supply to the amplifier; a first bypass switch configured to couple the first capacitor to the common-mode voltage supply while bypassing the first common-mode resistor; and a first data switch configured to couple the first capacitor to the amplifier, and to couple the first capacitor to the common-mode voltage supply through the first common-mode resistor.

In some embodiments, the photosensor is configured to receive the optical signal and to convert the optical signal to a current signal.

In some embodiments, preceding the preamble of the received optical signal, the first bypass switch is configured to couple the first capacitor to the common-mode voltage supply while bypassing the first common-mode resistor, and to couple the first capacitor to the amplifier through the first common-mode resistor.

In some embodiments, preceding the preamble of the received optical signal, the first data switch is configured to deactivate to break a resistive connection between the first capacitor and the common-mode voltage supply.

In some embodiments, preceding the data payload of the received optical signal, the first data switch is configured to couple the first capacitor to the amplifier through a path not including the first common-mode resistor, and to the common-mode voltage supply through the first common-mode resistor.

In some embodiments, preceding the data payload of the received optical signal, the first bypass switch is configured to deactivate to break a direct connection between the first capacitor and the common-mode voltage supply.

In some embodiments, the burst-mode receiver further includes a controller configured to control activated and deactivated states of the first bypass and data switches.

In some embodiments, the preamble precedes the data payload in time, and includes a balanced plurality of binary high and binary low bits.

In some embodiments, the amplifier is configured to generate an output voltage proportional to a current of the photosensor.

In some embodiments, the first bias resistor is configured to convert a current from the photosensor to a differential voltage signal.

In some embodiments, the burst-mode receiver further includes: a second bias resistor coupled between a second voltage supply and the photosensor; a second capacitor coupled between the photosensor and the amplifier; a second common-mode resistor configured to supply the voltage of the common-mode voltage supply to the amplifier; a second bypass switch configured to couple the second capacitor to the common-mode voltage supply while bypassing the common-mode resistor; and a second data switch configured to couple the capacitor to the amplifier, and to couple the capacitor to the common-mode voltage supply through the common-mode resistor.

In some embodiments, the first bias resistor is coupled between a cathode electrode of the photosensor and the first voltage supply, and the second bias resistor is coupled between an anode electrode of the photosensor and the second voltage supply.

In some embodiments, the first common-mode resistor couples a first input of the amplifier to the common-mode voltage supply, and the second common-mode resistor couples a second input of the amplifier to the common-mode voltage supply.

In some embodiments, the first capacitor is coupled between a cathode of the photosensor and a first input of the amplifier, the second capacitor is coupled between an anode of the photosensor and a second input of the amplifier.

In some embodiments, the first data switch is coupled between the first capacitor and the first input of the amplifier, the second data switch is coupled between the second capacitor and the second input of the amplifier, and the first and second data switches are configured to be concurrently activated or concurrently deactivated.

In some embodiments, the first bypass switch is coupled between the first capacitor and the common-mode voltage supply, the second bypass switch is coupled between the second capacitor and the common-mode voltage supply, and the first and second bypass switches are configured to be concurrently activated or concurrently deactivated.

According to some embodiments of the invention, there is provided a burst-mode receiver configured to receive an optical signal having a preamble and a data payload, the burst-mode receiver including: a bias resistor coupled between a first voltage supply and a photosensor; a capacitor coupled between the photosensor and an amplifier; a common-mode resistor configured to supply a voltage of a common-mode voltage supply to the amplifier; a data switch coupled between the capacitor and the amplifier; and a bypass switch coupled between the capacitor and the common-mode voltage supply; and a controller configured to activate the bypass switch, preceding the preamble, to couple the capacitor to the common-mode voltage supply while bypassing the common-mode resistor, the controller being further configured to activate the data switch, preceding the data payload, to couple the capacitor to the amplifier, and to couple the capacitor to the common-mode voltage supply through the common-mode resistor.

In some embodiments, the controller is further configured to activate the data switch, preceding the preamble, to bypass the common-mode resistor to couple the capacitor to the amplifier, and the controller is further configured to deactivate the bypass switch, preceding the data payload, to break a direct connection between the capacitor and the common-mode voltage supply.

In some embodiments, the amplifier is configured to generate an output voltage signal based on the payload data when the data switch is activated.

BRIEF DESCRIPTION OF THE DRAWINGS

The accompanying drawings, together with the specification, illustrate exemplary embodiments of the invention, and, together with the description, serve to explain the principles of the invention.

DETAILED DESCRIPTION

In the following detailed description, only certain exemplary embodiments of the invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as available for other similar features or aspects in other exemplary embodiments. Like reference numerals designate like elements throughout the specification.

Figure 1A:
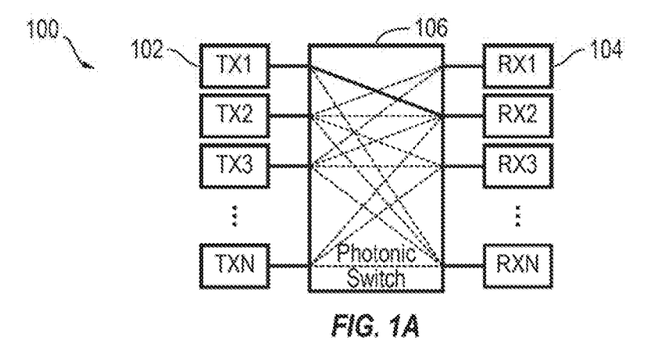
FIGS. 1A and 1B are schematic diagrams illustrating an optical switching system before and after a switching event, respectively, according to some exemplary embodiments of the invention.
Figure 1B:
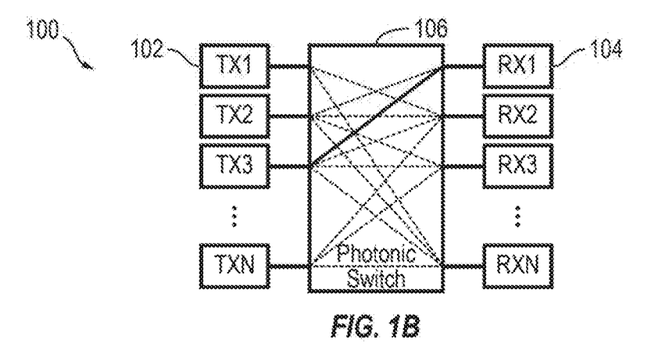
Figure 2:
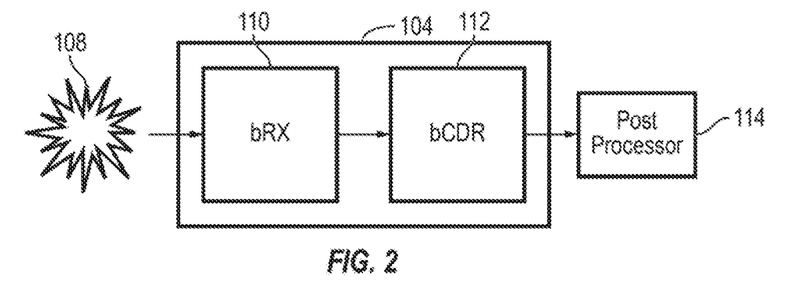
FIG. 2 is a block diagram illustrating an optical receiving module, according to some exemplary embodiments of the invention.

FIG. 1A is a schematic diagram illustrating an optical switching system 100 before a switching event, and FIG. 1B is a schematic diagram illustrating an optical switching system 100 after the switching event, according to some exemplary embodiments of the invention. FIG. 2 is a block diagram illustrating an optical receiving module 104, according to some exemplary embodiments of the invention.

Referring to FIGS. 1A and 1B, an optical switching system 100 includes a plurality of optical transmitting modules 102 for transmitting optical signals (e.g., amplitude modulated light), a plurality of optical receiving modules 104 for receiving the optical signals and converting the optical signals to analog or digital signals for processing, and an optical switch (e.g., a photonic switch) 106 for selectively switching the optical signals from one of the plurality of optical transmitting modules 102 to one of the plurality of optical receiving modules 104. The optical switch 106 may be coupled to the plurality of optical transmitting module 102 and the plurality of optical receiving modules 104 via optical fibers, open air connection, and/or the like.

According to some embodiments, after a switching event (as shown in FIGS. 1A and 1B), an affected optical receiving module 104 quickly adapts to the new level of incoming optical power, which may be significantly higher than a dark input state, for example, received optical power from one source may be about 0 dBm and from another it may be about −10 dBm. In some examples, the variation in optical power may be 20 dB or higher depending on the data rate of the incoming optical signal. As the phase variation between two bursty data packets may be as high as, the optical receiving modules 104 may further perform phase alignment on a packet-by-packet basis.

Referring to FIG. 2, the optical receiving module 104 includes a burst-mode receiver 110 for adapting to the amplitude of the received signal (from the light source 108) in a very short period of time, and a burst-clock data recovery (bCDR) circuit 112 for acquiring clock frequency and phase lock with the incoming optical signal. The total acquisition time (which is also referred to as "resynchronization time") is a sum of the time it takes to adapt to a new power level and the time it takes to re-acquire clock frequency and phase lock. While the exemplary embodiments of FIG. 2 illustrate the burst-mode receiver 110 being used in conjunction with the bCDR circuit 112, embodiments of the invention are not limited thereto. For example, the burst-mode receiver 110 may be used without the bCDR circuit 112 in any suitable system and/or application, as recognized by a person of ordinary skill in the art.

The burst-mode receiver 110, according to some embodiments of the invention, reduces the total acquisition time by greatly reducing the time it takes to adapt to the power level of the incoming burst of optical signal.

Figure 3:
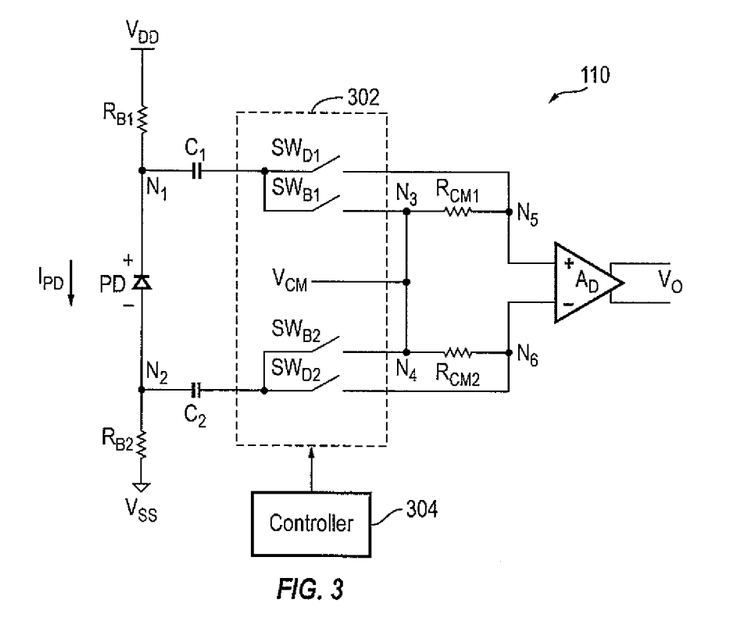
FIG. 3 is a schematic diagram illustrating a burst-mode receiver of an optical receiving module, according to some exemplary embodiments of the invention.

FIG. 3 is a schematic diagram illustrating a burst-mode receiver 110 of an optical receiving module 104, according to some exemplary embodiments of the invention.

According to some embodiments, the burst-mode receiver 110 includes first and second bias resistors $R_{B1}$ and $R_{B2}$, first and second capacitors $C_1$ and $C_2$, a switching network 302, a controller 304, first and second common-mode resistors $R_{CM1}$ and $R_{CM2}$, and an amplifier (e.g., a differential amplifier) $A_D$. The burst-mode receiver 110 may further include or be coupled to a photosensor (e.g., a photodiode) PD and a controller 304.

The first and second bias resistors $R_{B1}$ and $R_{B2}$ may respectively couple the cathode (at node N1) and anode (at node N2) of the photosensor PD to a first voltage supply (for providing a first supply voltage $V_{DD}$) and a second voltage supply (for providing a second supply voltage $V_{SS}$, e.g., ground), thereby providing power to (e.g., biasing) the photosensor PD, without the need for any active components (such as transistors). The first and second capacitors $C_1$ and $C_2$ are coupled between the anode and cathode of the photosensor PD and the switching network 302. The first and second common-mode resistors $R_{CM1}$ and $R_{CM2}$ are coupled between the switching network 302 at nodes N3 and N4 and the inputs of the amplifier $A_D$ at nodes N5 and N6, and provide a common mode voltage $V_{CM}$ to the inputs of the amplifier $A_D$. In some embodiments, the amplifier $A_D$ may be a differential amplifier having low noise, high input impedance, and high bandwidth. The amplifier $A_D$ may include a means of peaking the response of the photosensor-resistor network, which may have less bandwidth than that of the overall circuit of the burst-mode receiver 110, in order to improve (e.g., increase) the circuit sensitivity.

According to some embodiments, the switching network 302 includes first and second bypass switches $SW_{B1}$ and $SW_{B2}$ and first and second data switches $SW_{D1}$ and $SW_{D2}$. When activated (e.g., closed or turned ON), the first and second bypass switches $SW_{B1}$ and $SW_{B2}$ couple the first and second capacitors $C_1$ and $C_2$ to the common mode voltage $V_{CM}$ while bypassing the first and second common-mode resistors $R_{CM1}$ and $R_{CM2}$ (e.g., through a path not including the first and second common-mode resistors $R_{CM1}$ and $R_{CM2}$). Thus, after the first and second bypass switches $SW_{B1}$ and $SW_{B2}$ are deactivated (and, e.g., the first and second data switches $SW_{D1}$ and $SW_{D2}$ are activated), the first and second capacitors $C_1$ and $C_2$ may be charged to the same DC value ($V_{CM}$) as that of the inputs of the amplifier $A_D$. The first and second data switches $SW_{D1}$ and $SW_{D2}$, when activated (e.g., closed or turned ON), couple (e.g., directly couple) the first and second capacitors $C_1$ and $C_2$ (and hence the photosensor PD) to the inputs of the amplifier $A_D$. In some embodiments, the controller 304 controls and configures the switching network 302.

For convenience of illustration, henceforth it is assumed that the second supply voltage $V_{SS}$ is at ground voltage (i.e., about 0 v). However, embodiments of the present invention are not limited thereto, and the second supply voltage $V_{SS}$ may be at any suitable voltage.

Figure 4:
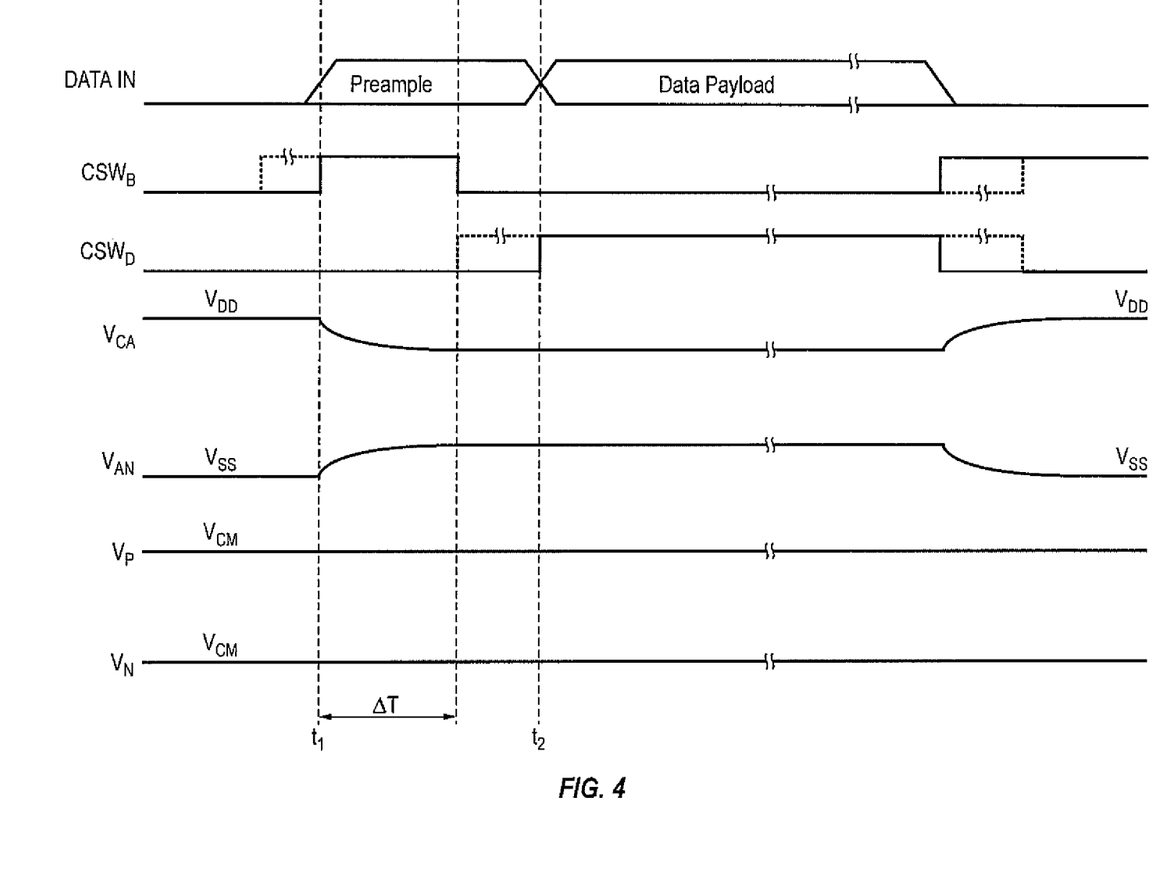
FIG. 4 is a timing diagram illustrating the operation of the burst-mode receiver according to some embodiments of the invention.

FIG. 4 is a timing diagram illustrating the operation of the burst-mode receiver 110 according to some embodiments of the invention.

Referring to FIGS. 3 and 4, in some embodiments of the invention, the burst-mode receiver 110 begins signal acquisition by activating, through the controller 304, the first and second bypass switches $SW_{B1}$ and $SW_{B2}$ either prior to or at the start of the high frequency DC balanced preamble (e.g., time $t_1$), which precedes a data payload of the optical signal (starting at time $t_2$). In some embodiments, the controller 304 further deactivates the first and second data switches $SW_{D1}$ and $SW_{D2}$ prior to time $t_2$. The preamble may include a repeating "101010 . . . " pattern or any other suitable balanced repeating pattern. However, embodiments of the present invention are not limited to a balanced repeating pattern, and any suitable preamble pattern may be used.

According to some embodiments, the controller 304 controls the activation/deactivation state of the first and second bypass switches $SW_{B1}$ and $SW_{B2}$ and the first and second data switches $SW_{D1}$ and $SW_{D2}$ via control signals (e.g., digital or analog control signals) $CSW_B$ and $CSW_D$, respectively. In some examples, a high level of the control signals $CSW_B$ and $CSW_D$ represents activation (e.g., an ON or closed state) of the corresponding switches, and a low level of the control signals $CSW_B$ and $CSW_D$ represents deactivation (e.g., an OFF or closed state) of the corresponding switches; however, embodiments of the invention are not limited thereto.

Prior to the photosensor PD receiving optical power (e.g., from the light source 108), the photosensor PD may generate substantially zero photocurrent. Thus, the anode voltage $V_{an}$ of the photosensor (at node N2) would have settled to ground voltage, the cathode voltage $V_{ca}$ of the photosensor (at node N1) would have settled to $V_{DD}$, and both of the input voltages to the amplifier $A_D$, $V_P$ and $V_N$ (at nodes N5 and N6, respectively), would have settled to the common-mode voltage $V_{CM}$. The voltage stored at the first capacitor $C_1$ would be $V_{DD}$-$V_{CM}$, and the voltage stored at the second capacitor $C_2$ would be $V_{CM}$.

According to some embodiments of the invention, prior to or during the preamble, the photosensor PD being illuminated with optical power (e.g., prior to time $t_1$), the first and second bypass switches $SW_{B1}$ and $SW_{B2}$ are activated to prepare the burst-mode receiver 110 for acquiring an incoming burst of optical power.

When the photosensor PD is illuminated with optical power, a photocurrent $I_{PD}$ is generated, flowing through the photosensor PD and the first and second bias resistors $R_{B1}$ and $R_{B2}$, and generating voltages $V_{ca}$ and $V_{an}$ at nodes N1 and N2, respectively. $I_{PD}$ includes a DC current $I_{PD}(dc)$ related to the average optical power and a modulated current $I_{PD}(ac)$ proportional to the optical modulation amplitude. As a result, both $V_{ca}$ and $V_{an}$ include DC and AC components that are proportional to those of $I_{PD}$.

The voltages $V_{ca}$ and $V_{an}$ may settle to their respective settled values within several time constants (e.g., 2.2-8 time constants for approximate settling to within about 80% to about 0.1% of final value, respectively) of $\tau$. The settled values of the voltages $V_{ca}$ and $V_{an}$ as well as the time constant $\tau$ may be approximated through the following Equations:

$$V_{ca} = V_{DD} - R_{B1} \times I_{PD}(dc) \quad \text{Equation (1)}$$

$$V_{an} = R_{B2} \times I_{PD}(dc) \quad \text{Equation (2)}$$

$$\tau = (R_{B1} + R_{B2}) \times [C_{PD} + (C_1 \times C_2)/(C_1 + C_2)] \quad \text{Equation (3)}$$

where $C_{PD}$ represents the reverse biased capacitance of the photosensor PD, which is, in some embodiments, significantly smaller than the capacitances $C_1$ and $C_2$.

In an example in which the resistances of the first and second bias resistors $R_{B1}$ and $R_{B2}$ are the same or substantially the same and the capacitances of the first and second capacitors $C_1$ and $C_2$ are also the same or substantially the same, and in which the value of $C_{PD}$ is, for example, about 1% of the value of $C_1$, the time constant $\tau$ may be approximated as $$\tau = R_{B1} \times C_1 \quad \text{Equation (4)}$$

As expressed in Equations 3 and 4, the resistances of the first and second common-mode resistors $R_{CM1}$ and $R_{CM2}$, which, in some embodiments, are significantly larger than the resistances of the first and second bias resistors $R_{B1}$ and $R_{B2}$, do not meaningfully affect the settling time of the voltages $V_{ca}$ and $V_{an}$. This is due to the fact that as the first and second bypass switches $SW_{B1}$ and $SW_{B2}$ are activated at the start of the preamble (time $t_1$), the first and second capacitors $C_1$ and $C_2$ AC couple, or pass the high frequency component (e.g., high frequency modulation content, while substantially blocking DC components) of, the electrical signal generated at the photosensor (e.g., voltages $V_{ca}$ and $V_{an}$) straight to the common-mode voltage supply without passing through (i.e., bypassing) the first and second common-mode resistors $R_{CM1}$ and $R_{CM2}$.

As described, after several time constants (e.g., N time constants, where N is a positive integer) have elapsed, settling will have occurred such that the DC voltage across both first and second capacitors $C_1$ and $C_2$ may no longer be changing, and the voltages $V_{ca}$ and $V_{an}$ may settle to the values expressed in Equations 1 and 2. In some embodiments, the first and second bias resistors $R_{B1}$ and $R_{B2}$ are selected such that the settling times $N \times \tau_1$ and $N \times \tau_2$ are shorter than the duration of the preamble. Thus, according to embodiments of the invention, the voltages $V_{ca}$ and $V_{an}$ generated by the photosensor PD, and hence, the amplifier input voltages $V_P$ and $V_N$ settle prior to the start of the data payload of the optical signal.

After the burst-mode receiver 110 has settled (e.g., a time $\Delta T$ after time $t_1$ or later) and prior to the start of the data payload, the controller 304 deactivates the first and second bypass switches $SW_{B1}$ and $SW_{B2}$, and, simultaneously or thereafter, activates the first and second data switches $SW_{D1}$ and $SW_{D2}$. In some examples, simultaneous switching may be adequate if switching is very fast and if parasitic capacitances of said switches are small compared to the first and second capacitors $C_1$ and $C_2$. According to some embodiments, the controller 304 activates the first and second data switches $SW_{D1}$ and $SW_{D2}$ prior to the start of the data payload (i.e., time $t_2$).

After the switching of the switching network 302, the first capacitor $C_1$ remains charged to voltage $V_{DD} - V_{CM}$, and the second capacitor $C_2$ remains charged at $V_{CM}$, hence, the amplifier input voltages $V_P$ and $V_N$ do not change and remain at $V_{CM}$. Further, as the DC value of voltages $V_P$ and $V_N$ are the same or substantially the same, the common mode voltage of the amplifier $A_D$ remains unchanged, and any DC stabilizing circuitry within the amplifier $A_D$ may be unaffected by the burst of incoming optical signal. Thus, when receiving the data payload of the optical signal, the amplifier $A_D$ of the burst-mode receiver 110 is biased optimally for gain, bandwidth, and low duty cycle distortion.

The modulated current $I_{PD}(ac)$ generates voltages $V_{ca}(ac)$ and $V_{an}(ac)$, at noted N1 and N2, which may be expressed as:

$$V_{ca}(ac) = -R_{B2} \times I_{PD}(ac) \quad \text{Equation (5)}$$

$$V_{an}(ac) = R_{B2} \times I_{PD}(ac) \quad \text{Equation (6)}$$

The first and second capacitors $C_1$ and $C_2$ AC couple voltages $V_{ca}(ac)$ and $V_{an}(ac)$ through the switching network 302 to the inputs of the amplifier $A_D$ as voltages $V_P$ and $V_N$, at nodes N5 and N6, respectively. As the voltages $V_{ca}(ac)$ and $V_{an}(ac)$ of Equations 5 and 6 are out of phase by 180 degrees, they add constructively at the input of the amplifier $A_D$ due to the sign difference of the two voltages. Therefore, the differential voltage at the input of the amplifier $A_D$ (i.e., $V_P - V_N$) will be $(R_{B2} + R_{B2}) \times I_{PD}(ac)$. The amplifier $A_D$ then amplifies the differential voltage at its input to generate an output voltage $V_O$, which is supplied to other circuitry (e.g., the post processor 114) for further data processing. The common-mode voltage $V_{CM}$ maintains the DC component of $V_P$ and $V_N$ within the acceptable common mode voltage range of the amplifier $A_D$. Baseline wander may be kept small by making the time constants $R_{CM1} \times C_1$ and $R_{CM2} \times C_2$ large relative to the elapsed time of consecutive identical bits within the data packet.

In some embodiments, the resistances $R_{CM1}$ and $R_{CM2}$ are much greater than $R_{B1}$ and $R_{B2}$ so that the first and second common-mode resistors $R_{CM1}$ and $R_{CM2}$ do not attenuate the voltage substantially, or substantially affect the time constants and settling described herein.

According to some embodiments, the common-mode voltage $V_{CM}$ is chosen such that the amplifier $A_D$ functions with zero or very small DC offset between inputs at nodes N5 and N6, and is biased in the region of high (e.g., maximum) gain (e.g., around its optimum common mode voltage). This may prevent or substantially prevent duty cycle distortion, which may otherwise result if the input DC offset is non-zero.

In some embodiments, the resistances of the first and second bias resistors $R_{B1}$ and $R_{B2}$ and the first and second common-mode resistors $R_{CM1}$ and $R_{CM2}$ are chosen such that the input bias current of the amplifier $A_D$ into nodes N5 and N6 times the corresponding resistances $R_{CM1}$ and $R_{CM2}$ is small compared to the voltages $R_{B1} \times I_{PD}(dc)$ and $R_{B1} \times I_{PD}(dc)$.

Prior to the first and second data switches $SW_{D1}$ and $SW_{D2}$ being closed (e.g., prior to time $t_2$), no data can may be passed through the amplifier $A_D$. Prior to this time, if any data were to be transmitted it will be lost. In some embodiments, to speed the settling described above, a preamble consisting of a repeating 1010 pattern may be transmitted. The duration of the preamble is adjusted to be long enough to allow the settling to occur. In an example in which there is a timing skew between the controller 304 and the remainder of the burst-mode receiver circuit, the preamble is lengthened to account for the skew to ensure that adequate settling is guaranteed. Precision timing methods may be used to reduce this skew to near zero.

In some examples, the burst-mode receiver 110 may be used at a data rate of about 25.78 Gbps. In such cases, component values may be: $C_{PD}<50$ fF, $R_{B1}=R_{B2}=100$, $C_1=C_2=1$ pF, $R_{CM1}=R_{CM2}=100$ kΩ, and $V_{DD}=1.5$ V. Choosing higher values of $R_{B1}$ or $R_{B2}$ may improve (e.g., increase) sensitivity but also lengthen the settling time τ of Equations 3 and 4. Similarly, larger values of $C_1$ or $C_2$ may increase the settling time τ. Too small a value for these capacitors may result in attenuation relative to the input capacitance of the amplifier $A_D$, or may result in baseline wander if the value $C_1 \times R_{CM1}$ or $C_1 \times R_{CM2}$ is too small. Thus, in some examples, the capacitances of the first and second capacitors $C_1$ and $C_2$ are selected to be much larger than the input capacitance of the amplifier $A_D$. Following Equation 3, for such exemplary values, the time required for settling sufficient to avoid duty cycle distortion is about (100 Ω+100Ω)×(50 fF+0.5 pF)× 8=880 ps. Here, the factor 8 is chosen as a multiplier N because after 8 time constants settling to within about 0.1% of final value will have occurred. This may be sufficiently accurate for a circuit of this type. The exemplary values provided here are for illustrative purposes only, and embodiments of the present invention are not limited thereto.

The burst-mode receiver 110, according to some embodiments, is capable of operating at very low and very high optical input power. For example, at 25.78 Gbps or similar data rates, low input power may be considered to be about −12 dBm to about −15 dBm, photosensor PD responsivity may be about 0.5 to about 1.0 for a PIN diode, and high input power may be considered to be about +3 dBm to about +5 dBm. However, embodiments of the present invention may operate at wider ranges.

Thus, as described herein, the burst-mode receiver 110, according to embodiments of the invention, may be able to achieve acquisition times that may be an order of magnitude (or more) improvement over related art feedback or feedback type receivers. Further, as relatively few elements are used in a simple circuit, which does not employ a pre-amplifier or a feedback loop, performance parameters such as receiver sensitivity, allowable signal dynamic range, power dissipation, robustness, reliability, and overall cost are greatly improved over existing solutions.

In some embodiments, after receiving the entirety of the data payload, the controller 304 deactivates the first and second bypass switches $SW_{B1}$ and $SW_{B2}$ and activates the first and second data switches $SW_{D1}$ and $SW_{D2}$.

According to some embodiments, the burst-mode receiver 110 may be symmetrical; that is, the value of the bias resistors $R_{B1}$ and $R_{B2}$ may be the same, the value of the capacitors $C_1$ and $C_2$ may be the same, and the value of the common-mode resistors $R_{CM1}$ and $R_{CM2}$ may be the same. However, embodiments of the invention are not limited thereto, and said values may be different from one another.

In some embodiments, the bypass switches $SW_{B1}$ and $SW_{B2}$ and the data switches $SW_{D1}$ and $SW_{D2}$ are implemented using transistors, e.g., PMOS and/or NMOS transistors. However, embodiments of the invention are not limited thereto and said switches may be implemented in any other suitable manner.

In some examples, the photosensor PD may be integrated with the circuitry of the burst-mode receiver 110. In other examples, the photosensor PD may be an element external to the circuitry of the burst-mode receiver 110, and be electrically coupled to it via corresponding pinouts of the burst-mode receiver 110.

The burst-mode receiver, and/or any other relevant devices or components according to embodiments of the invention described herein, may be implemented utilizing any suitable hardware, firmware (e.g., an application-specific integrated circuit, field programmable gate arrays, and/or the like), software, or a suitable combination of software, firmware, and hardware. For example, the various components of the burst-mode receiver may be formed on one integrated circuit (IC) chip or on separate IC chips. Further, the various components of each of the burst-mode receiver may be implemented on a flexible printed circuit film, a tape carrier package (TCP), a printed circuit board (PCB), or formed on a same substrate.

While one or more exemplary embodiments of the invention have been described with reference to the figures, it will be understood by those of ordinary skill in the art that various suitable changes in form and details may be made therein without departing from the spirit and scope of the invention as defined by the following claims, and equivalents thereof.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept." Also, the term "exemplary" is intended to refer to an example or illustration.

It will be understood that when an element, component, or layer is referred to as being "connected to" or "coupled to" another element, component, or layer, it can be directly connected to or coupled to the other element, component, or layer, or one or more intervening elements, components, or layers may be present. When an element or layer is referred to as being "directly on," "directly connected to" or "directly coupled to" another element, component, or layer, there are no intervening elements, component, or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

What is claimed is:

1. A burst-mode receiver configured to receive an optical signal having a preamble and a data payload, the burst-mode receiver comprising:
   a first bias resistor coupled between a first voltage supply and a photosensor;

a first capacitor coupled between the photosensor and an amplifier;

a first common-mode resistor configured to supply a voltage of a common-mode voltage supply to the amplifier;

a first bypass switch configured to couple the first capacitor to the common-mode voltage supply while bypassing the first common-mode resistor; and a first data switch configured to couple the first capacitor to the amplifier, and to couple the first capacitor to the common-mode voltage supply through the first common-mode resistor.

2. The burst-mode receiver of claim 1, wherein the photosensor is configured to receive the optical signal and to convert the optical signal to a current signal.

3. The burst-mode receiver of claim 2, wherein, preceding the preamble of the received optical signal, the first bypass switch is configured to couple the first capacitor to the common-mode voltage supply while bypassing the first common-mode resistor, and to couple the first capacitor to the amplifier through the first common-mode resistor.

4. The burst-mode receiver of claim 2, wherein, preceding the preamble of the received optical signal, the first data switch is configured to deactivate to break a resistive connection between the first capacitor and the common-mode voltage supply.

5. The burst-mode receiver of claim 2, wherein, preceding the data payload of the received optical signal, the first data switch is configured to couple the first capacitor to the amplifier through a path not comprising the first common-mode resistor, and to the common-mode voltage supply through the first common-mode resistor.

6. The burst-mode receiver of claim 2, wherein, preceding the data payload of the received optical signal, the first bypass switch is configured to deactivate to break a direct connection between the first capacitor and the common-mode voltage supply.

7. The burst-mode receiver of claim 1, further comprising a controller configured to control activated and deactivated states of the first bypass and data switches.

8. The burst-mode receiver of claim 1, wherein the preamble precedes the data payload in time, and comprises a balanced plurality of binary high and binary low bits.

9. The burst-mode receiver of claim 1, wherein the amplifier is configured to generate an output voltage proportional to a current of the photosensor.

10. The burst-mode receiver of claim 1, wherein the first bias resistor is configured to convert a current from the photosensor to a differential voltage signal.

11. The burst-mode receiver of claim 1, further comprising:

a second bias resistor coupled between a second voltage supply and the photosensor;

a second capacitor coupled between the photosensor and the amplifier;

a second common-mode resistor configured to supply the voltage of the common-mode voltage supply to the amplifier;

a second bypass switch configured to couple the second capacitor to the common-mode voltage supply while bypassing the second common-mode resistor; and a second data switch configured to couple the second capacitor to the amplifier, and to couple the second capacitor to the common-mode voltage supply through the second common-mode resistor.

12. The burst-mode receiver of claim 11, wherein the first bias resistor is coupled between a cathode electrode of the photosensor and the first voltage supply, and the second bias resistor is coupled between an anode electrode of the photosensor and the second voltage supply.

13. The burst-mode receiver of claim 11, wherein the first common-mode resistor couples a first input of the amplifier to the common-mode voltage supply, and the second common-mode resistor couples a second input of the amplifier to the common-mode voltage supply.

14. The burst-mode receiver of claim 11, wherein the first capacitor is coupled between a cathode of the photosensor and a first input of the amplifier, the second capacitor is coupled between an anode of the photosensor and a second input of the amplifier.

15. The burst-mode receiver of claim 14, wherein the first data switch is coupled between the first capacitor and the first input of the amplifier, the second data switch is coupled between the second capacitor and the second input of the amplifier, and the first and second data switches are configured to be concurrently activated or concurrently deactivated.

16. The burst-mode receiver of claim 11, wherein the first bypass switch is coupled between the first capacitor and the common-mode voltage supply, the second bypass switch is coupled between the second capacitor and the common-mode voltage supply, and the first and second bypass switches are configured to be concurrently activated or concurrently deactivated.

17. A burst-mode receiver configured to receive an optical signal having a preamble and a data payload, the burst-mode receiver comprising:

a bias resistor coupled between a first voltage supply and a photosensor;

a capacitor coupled between the photosensor and an amplifier;

a common-mode resistor configured to supply a voltage of a common-mode voltage supply to the amplifier;

a data switch coupled between the capacitor and the amplifier; and a bypass switch coupled between the capacitor and the common-mode voltage supply; and a controller configured to activate the bypass switch, preceding the preamble, to couple the capacitor to the common-mode voltage supply while bypassing the common-mode resistor, the controller being further configured to activate the data switch, preceding the data payload, to couple the capacitor to the amplifier, and to couple the capacitor to the common-mode voltage supply through the common-mode resistor.

18. The burst-mode receiver of claim 17, wherein the controller is further configured to activate the data switch, preceding the preamble, to bypass the common-mode resistor to couple the capacitor to the amplifier, and wherein the controller is further configured to deactivate the bypass switch, preceding the data payload, to break a direct connection between the capacitor and the common-mode voltage supply.

19. The burst-mode receiver of claim 17, wherein the amplifier is configured to generate an output voltage signal based on the payload data when the data switch is activated.

* * * * *